United States Patent [19]

Danby et al.

[11] Patent Number: 4,766,378

[45] Date of Patent: Aug. 23, 1988

[54] NUCLEAR MAGNETIC RESONANCE SCANNERS

[75] Inventors: Gordon T. Danby, Wading River; Hank C. H. Hsieh, Ronkonkoma; John W. Jackson, Shoreham; Raymond V. Damadian, Woodbury, all of N.Y.

[73] Assignee: Fonar Corporation, Melville, N.Y.

[21] Appl. No.: 935,933

[22] Filed: Nov. 28, 1986

[51] Int. Cl.$^4$ ............................................. G01R 33/20
[52] U.S. Cl. .................................... 324/307; 324/319
[58] Field of Search ............... 335/216, 301; 324/300, 324/307, 309, 318, 319, 320, 322; 128/653

[56] References Cited

U.S. PATENT DOCUMENTS

| 2,894,199 | 7/1959 | Kirchner | 324/319 |
| 2,930,966 | 3/1960 | Bell et al. | 324/319 |
| 3,030,556 | 4/1962 | Watson | 335/298 |
| 3,253,194 | 5/1966 | Parker | 335/302 |
| 3,437,963 | 4/1969 | Gang et al. | 335/298 |
| 3,564,396 | 2/1971 | Nelson | 330/85 |
| 4,048,555 | 9/1977 | Rupp, Jr. et al. | 324/320 |
| 4,093,912 | 6/1978 | Double et al. | 324/318 |
| 4,122,386 | 10/1978 | Tomita et al. | 324/320 |
| 4,254,778 | 3/1981 | Clow et al. | 128/653 |
| 4,422,042 | 12/1983 | Sugimoto | 324/319 |
| 4,590,428 | 5/1986 | Muller et al. | 324/320 |
| 4,675,609 | 6/1987 | Danby et al. | 324/318 |
| 4,707,663 | 11/1987 | Minkoff et al. | 324/319 |

FOREIGN PATENT DOCUMENTS

0050422 3/1985 Japan .

Primary Examiner—Michael J. Tokar
Attorney, Agent, or Firm—Lerner, David, Littenberg, Krumholz & Mentlik

[57] ABSTRACT

A medical nuclear magnetic resonance system is provided with a primary field magnet assembly having a ferromagnetic frame. The system resists field variations caused by coil movement and confines the field within the frame.

53 Claims, 5 Drawing Sheets

FIG-3

NUCLEAR MAGNETIC RESONANCE SCANNERS

BACKGROUND OF THE INVENTION

The present invention pertains to medical nuclear magnetic resonance scanners.

Since the invention of the medical nuclear magnetic resonance (NMR) scanning technique by Dr. Raymond Damadian, as set forth in U.S. Pat. No. 3,789,832, this technique has been widely adopted in the medical arts. Medical NMR scanning requires creation of a substantial constant "primary" magnetic field passing through the patient's body. An additional "gradient" magnetic field varying with time typically is superimposed on the primary field. The patient is exposed to radio frequency electromagnetic waves which also vary with time in particular patterns. Under the influence of the magnetic fields and the radio waves, certain atomic nuclei within the patient's tissues resonate and emit further radio waves. By mathematical techniques involving correlation of the magnetic field patterns in use at various times with the radio frequency waves emitted, it is possible to determine the amounts of particular atomic nuclei, and hence the amounts of particular substances, at various locations within the patient's body. This information typically is displayed as an image with shadings corresponding to the concentrations of certain nuclei of interest. The concentrations of different substances ordinarily differ for differing kinds of tissues. Thus, the image created through NMR techniques permits the physician to see organs and soft tissues within the body, and also permits the physician to see abnormalities, such as tumors, within the body. Accordingly, NMR scanning and imaging techniques are being adopted rapidly by physicians.

Medical NMR scanning imposes certain challenging technical requirements for the apparatus. The primary magnetic field must be a strong field, typically on the order of about 1 kilogauss or more and often more than about 10 kilogauss (one Tesla), far stronger than the magnetic fields associated with common magnets. Moreover, the primary magnetic field must be precisely configured. Thus, the primary field, before application of the gradient fields, should be uniform to at least about one part in 1,000 and preferably at least about one part in 10,000 or better in order to provide a useful image. Even better uniformity is more desirable. This strong, uniform primary magnetic field must be maintained over a region of the patient's body large enough to provide medically useful information, typically over a scanning region encompassing a major portion of a cross section through the patient's torso. Further, the magnetic field apparatus typically must be arranged to receive the patient's body, and hence must provide openings large enough for the patient's body to fit within the apparatus. All of these requirements, taken together, pose a formidable technical problem.

Two distinct and fundamentally different approaches to these requirements are currently employed in construction of medical NMR scanners. As set forth in co-pending, commonly assigned U.S. patent application Ser. No. 841,897, filed Mar. 20, 1986 now U.S. Pat. No. 4,675,609, magnetic field producing means such as permanent magnets can be combined with a ferromagnetic metal frame and other components to form a magnetic assembly which provides the primary field. The disclosure of said U.S. Pat. No. 4,675,609 is hereby incorporated by reference herein. Medical NMR scanners incorporating magnetic assemblies according to the U.S. Pat. No. 4,675,609 application have excellent primary fields and hence offer good scanning capabilities. However, it is difficult and expensive to provide particularly strong primary fields in excess of about 1 Tesla, as desired in some NMR scanning techniques, while still meeting all of the other requirements if only permanent magnets are employed.

The other approach has been to employ electromagnets, most notably, complex solenoidal superconducting electromagnets. The windings of a superconducting magnet lose resistance to flow of electric current when cooled below a particular threshold temperature close to absolute zero ($-273°$ C.). Thus superconducting magnets can carry large currents and can create high fields. Superconducting magnet scanners typically employ a pair of loop-like main superconducting coils and a plurality of auxiliary loop-like superconducting coils. The coils are aligned on a common coil axis to form a single large complex solenoid. This solenoid is enclosed in a toroidal or doughnut-shaped vessel or cryostat having a central opening of sufficient size to receive a patient with the patient's body extending generally along the axis of the toroid. Thus, the long axis of the patient's body is aligned with the axis of the solenoid. When the coils are energized, they generate a magnetic field extending through the patient's body, generally along the long axis of the patient's body. Minor amounts of iron or other ferromagnetic materials are occasionally employed for adjusting or "shimming" the shape of the field, but these devices are basically large, air-core solenoids. The shape of the magnetic field in the scanning region is predominantly influenced by the placement of multiple coils. The auxiliary coils utilized in the solenoid are essential to creation of a uniform field with parallel lines of flux extending through the patient's body.

Although substantial fields can be created by means of these devices, they pose significant problems. It is difficult to maintain a uniform, constant primary field, in part because the coils tend to move when energized. Thus, the coils, when energized, exert substantial magnetic forces, on the order of tens to hundreds of tons, pulling the coils towards one another and tending to spread each coil radially outwardly, away from the coil axis. These movements tend to destroy the uniformity of the field. Attempts to brace and support the coils so as to resist these forces introduce additional problems. Typically, the bracing elements used to resist these magnetic forces are entirely enclosed within the cryostat. The bracing elements thus add to the mass which must be supported within the cryostat and add to the volume of material which must be maintained at ultra-low temperatures within the cryostat. Thus, these bracing elements complicate design of the system. Even with substantial braces, coil movement still poses significant problems. As the magnetic forces on the coils increase with the square of the field strength, the problems associated with these forces have posed serious impediments to successful medical NMR scanning at very high fields, above about 2 Tesla.

The magnetic field created by an air-core superconductive solenoid extends outside of the scanner. Therefore, any moving magnetic material in proximity to the scanner with disturb the field and impair the image. The substantial magnetic fields extending outside an air-core superconducting solenoid type NMR scanner can be dangerous. When such a device is energized, magnetic material lying loose within a few feet of the device can be attracted with such force that it becomes a deadly missile. These effects can and have caused injuries in operation of air-core superconducting NMR scanners. To minimize the safety hazards and field disturbances, superconducting NMR scanners heretofore have been encased in large and elaborate sanctuaries. In some cases, ferromagnetic shields have been placed around air-core superconducting solenoid NMR scanners. Ordinarily, these shields have been disposed at considerable distances from the coils and from the patient receiving portions of the device, so that these shields exert no appreciable influence on the shape of field in the scanning region.

Moreover, at least some of the coils in an air-core superconducting scanner typically must be disposed in close proximity to the scanning region. Therefore, the walls of the cryostat enclosing the coils must closely surround the scanning region. As the gradient coils also are disposed close to the scanning region, the gradient coils typically must be disposed adjacent the cryostat walls. It is typically desirable in NMR scanning to vary the fields imposed by the gradient coils at relatively rapid rates. In some cases, non-metallic, electrically non-conductive materials have been utilized instead of metals for the walls of the cryostats to avoid creation of eddy currents in the cryostat wall as the field imposed by the gradient coils varies. These materials are less desirable than metals with regard to strength and other properties desired in the cryostat wall.

For all of these reasons, there have been significant needs heretofore for further improvement in medical NMR scanners.

SUMMARY OF THE INVENTION

The present invention provides NMR scanners which meet those needs.

One aspect of the present invention provides a medical NMR scanner having a primary field magnet assembly including a frame formed from a ferromagnetic material, typically iron. The frame defines a patient-receiving space. The frame includes a pair of opposed structures aligned with one another. These opposed structural elements form a pair of opposed polar regions defining a polar axis, the polar regions being disposed on opposite sides of the patient receiving space. The patient receiving space is adapted to receive a normal human body, i.e., to receive the torso of a normal adult human body. Preferably, the patient receiving space is arranged to receive the body so that the long or head-to-toe axis of the body extends transverse to the polar axis and, most preferably, so that the anterior-posterior axis of the body is parallel to the polar axis. Most preferably, the frame defines a substantially continuous flux return path extending between the polar regions remote from the patient space.

The primary field magnet assembly also includes flux-generating means having windings for generating magnetic flux upon passage of an electric current through the windings. Most preferably, the windings are formed from superconducting materials, and cryostat means are provided for maintaining the windings under superconducting conditions, i.e., below the threshold temperature of the superconducting material. Support means are provided for maintaining the windings in proximity to the frame so that when electricity is passed through the windings, the flux from the windings passes through the frame and passes between the polar regions, through the patient space. The frame thus shapes the field to create the desired, substantially uniform primary field within a predetermined scanning volume in the patient space, typically a scanning volume centered on the polar axis. Typically, the field in the scanning volume is constituted by flux passing between the poles, parallel to the polar axis. Most preferably, the configuration of the frame, and the position of the windings relative to the frame are selected so that the flux entering the scanning volume enters predominantly through the polar regions of the frame. Stated another way, the primary field magnets used in preferred scanners according to the present invention are ferromagnetic or iron core superconducting magnets, as opposed to iron-perturbed or iron-shielded air-core superconducting magnets.

In scanners according to this aspect of the present invention, the difficulties associated with superconducting coils heretofore are substantially mitigated. Because the ferromagnetic frame concentrates are flux along the polar axis within the surrounding volume, the current flows required in the superconducting windings to achieve a given flux density are dramatically reduced. Accordingly, the magnetic forces of the windings are likewise reduced, thereby minimizing the forces applied to displace the coils during operation. Moreover, the sensitivity of the field in the scanning volume to movement of the windings is dramatically reduced. Although the present invention is not limited by any theory of operation, it is believed that this effect is caused by the tendency of the ferromagnetic frame to resist any change in flux distribution, as further explained hereinbelow. All of these effects contribute to maintenance of uniform, strong primary magnetic fields in preferred scanners according to the present invention, and hence contribute to imaging performance. Because the problems associated with coil movement are substantially mitigated, higher fields than previously employed in medical NMR scanning can be employed, if desired, in a practical medical NMR scanning device according to preferred aspects of the present invention.

In particularly preferred scanners according to the present invention, the frame includes a pair of opposed, platelike ferromagnetic end pieces aligned with one another and disposed on opposite sides of the patient receiving space. The end pieces preferably extend parallel to one another and transverse to the polar axis. The end pieces desirably are positioned so that the polar axis extends through each end piece. The frame preferably also includes at least one axial connecting element extending between the end pieces, substantially codirectionally with the polar axis. Preferably, two or more axial connecting elements are disposed on opposite sides of the patient-receiving space. The windings typically involve a pair of loop-like, preferably circular coils extending generally in coil planes transverse to the polar axis, the axis of each coil being substantially aligned with the polar axis of the frame. The coils are preferably disposed between the end pieces in the internal space enclosed by the end pieces and the axial connecting elements so that the plane of each coil extends generally parallel to the plane of the adjacent end piece.

In this preferred arrangement, each coil is attracted to the other coil, but each coil is also attracted to the adjacent end piece. Thus the magnetic forces exerted by the coils on one another, tending to move the coils towards one another, are substantially balanced by magnetic forces exerted by the end pieces on the coils tending to pull the coils away from one another. This substantial balancing of magnetic forces in the axial direction dramatically reduces the tendency of the coils to shift during operation, and hence further reduces primary field non-uniformities caused by coil movement.

The magnetic field is substantially confined by the frame. Thus, the return portion of the flux field carrying lines of flux in the opposite direction to the flux between the poles is substantially concentrated in the continuous ferromagnetic flux return path defined by the frame. Preferably, the axial supporting members and end pieces form a substantially closed space, apart from patient entry openings through or between the axial connecting elements for insertion of the patient's body into the patient receiving space. The safety hazards posed by unconfined fields formerly associated with superconducting NMR scanners are eliminated. Moreover, the field is protected from the disturbing influences of moving objects outside the frame, leading to further improvements in field uniformity and further improvements in performance of the overall NMR system.

Various arrangements can be used according to the present invention to maximize particular benefits. In one arrangement, the frame includes a pair of opposed ferromagnetic pole pieces extending towards one another from the end pieces on the polar axis, through the centers of the coils, the pole pieces defining the polar regions of the frame in close juxtaposition to the patient-receiving space and hence in close juxtaposition to the scanning volume. Preferably, each pole piece includes a frustoconical pole facing piece having a circular face transverse to the polar axis and confronting the patient space. Each such circular face preferably has a diameter substantially larger than the diameter of the scanning volume where the uniform field is desired. Thus, the diameter of each such circular face is preferably at least about 50", most preferably about 54" or more. The base or larger diameter end of the pole facing piece, disposed remote from the patient space and in proximity to the end piece, desirably has a diameter of about 60" or more, most preferably about 64" or more. Each pole piece may also include a pole stem of diameter equal to or greater than the larger diameter of the pole facing piece interposed between the pole facing piece and the end piece. As further explained hereinbelow, this arrangement can provide uniform fields of 1 Tesla or more over a 12" diameter scanning volume.

In another arrangement, the polar regions of the frame may be disposed remote from the scanning volume, i.e., at a substantial distance along the polar axis from the scanning volume. The frame may be arranged so that the frame does not penetrate through the coils. The polar regions are thus defined principally by the end pieces and by ferromagnetic material in relatively close proximity to the end pieces. As further explained hereinbelow, this arrangement facilitates application of a uniform primary field directed along the polar axis with a field strength higher than the saturation level of the frame material.

The coils, and hence the toroidal cryostats enclosing the coils, may have diameters significantly greater than the diameter of the scanning volume. In the remote pole arrangement, the space immediately adjacent the scanning volume is substantially remote from any other structure of the primary field magnet assembly. The gradient coils may be disposed in these unencumbered spaces. The gradient coils therefore will not induce eddy currents in the frame or in the cryostat even where metallic, conductive cryostats are employed. These features serve to enhance the quality and speed of scanning. Moreover, the ability to employ metallic cryostats without loss of performance greatly simplifies design and construction of the system.

Thus, the present invention offers considerable improvements in medical NMR scanning apparatus.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
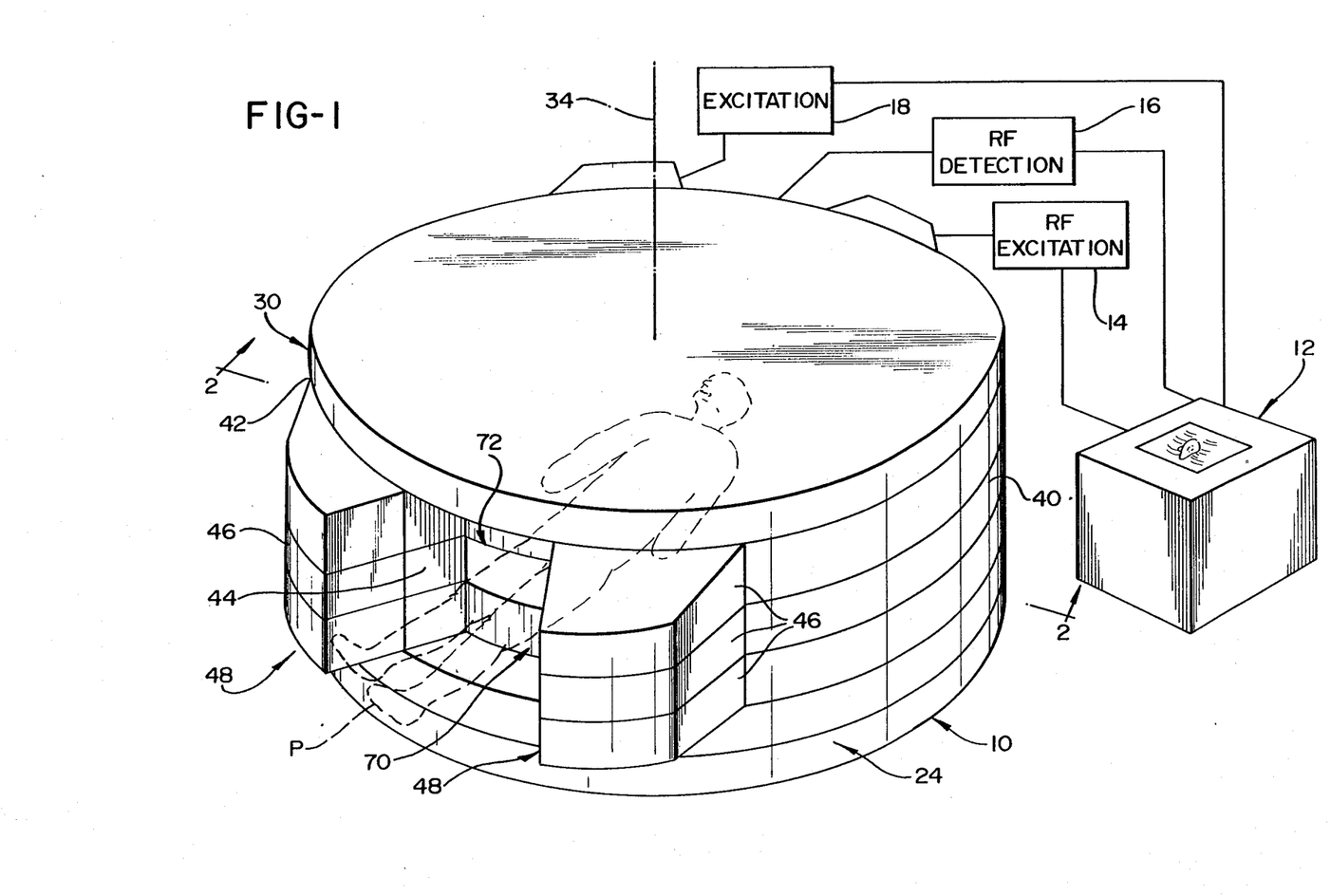
FIG. 1 is a schematic perspective view of apparatus according to one embodiment of the present invention, with some components shown in block form.

A nuclear magnetic resonance scanner according to one aspect of the present invention includes a primary field magnet assembly 10 and a conventional control, computing and image display unit 12. The apparatus also incorporates conventional RF excitation and RF detection units 14 and 16 which are linked to control unit 12. Also, conventional gradient excitation means 18 are linked to control unit 12 and to gradient field coils 20 (FIG. 2) disposed within the primary field magnet assembly.

Figures 2, 2A:
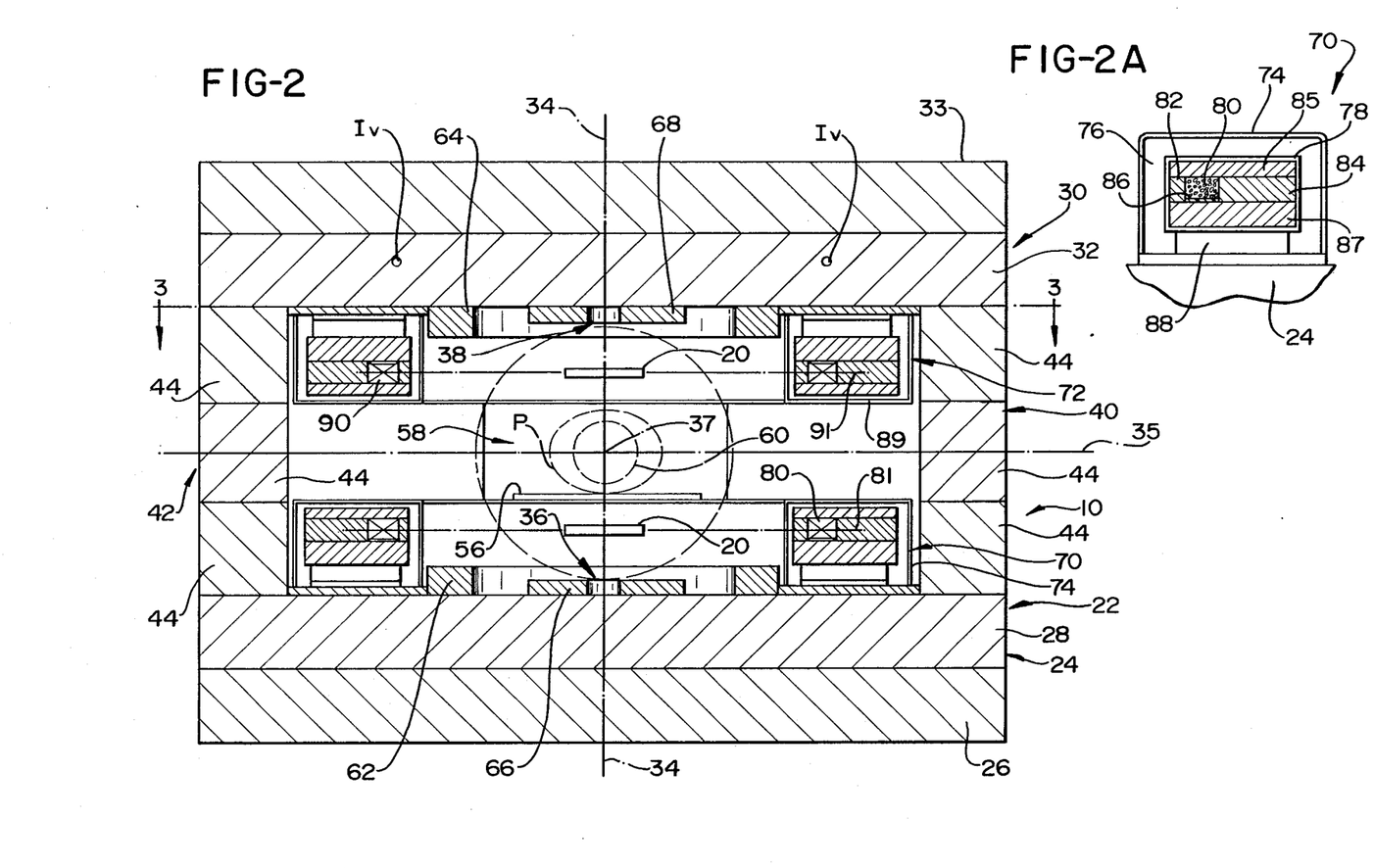
FIG. 2 is a schematic sectional view taken along line 2—2 in FIG. 1.
FIG. 2A is a schematic sectional view on an enlarged scale depicting the area indicated in FIG. 2.

Primary field magnet assembly 10 includes a frame 22 formed from a "magnetically soft" ferromagnetic material. As utilized herein, the term "magnetically soft" refers to a material which can be readily magnetized, i.e., a material of low coercive force. Low carbon steel is the preferred material for the frame, and is employed for all components of frame 22 unless otherwise indicated below. The frame includes a lower end piece 24 comprising a bottom plate 26 and a top plate 28, and a similar upper end piece 30 comprising a lower plate 32 and an upper plate 33. All of these plates are substantially circular, and the plates of each end piece are coaxial with one another, so that each of end pieces 24 and 30 is substantially cylindrical. These cylindrical end pieces are aligned with one another on a vertical polar axis 34. The end pieces are substantially parallel with one another. Frame 22 also includes a pair of outer shim rings 62 and 64 mounted to lower end piece 24 and upper end piece 30, respectively, so that the outer shim rings 64 are coaxial with polar axis 34 and the shim rings project axially inwardly, from the end pieces towards medial plane 35. As used in this disclosure, the term "axially inwardly" refers to the directions parallel to the polar axis toward the medial plane. A pair of inner shim rings 66 and 68 are also mounted on the lower and upper end pieces 24 and 30, respectively. The inner shim rings are in the form of short, thick-walled cylinders and are also coaxial with polar axis 34. As best seen in FIG. 2, the inner shim rings 66 and 68 project axially inwardly from the end pieces, the inner shim rings being encompassed within the outer shim rings 62 and 64. The end pieces and shim rings cooperatively define a pair of opposed polar regions 36 and 38 surrounding the polar axis and facing toward one another. The polar regions 36 and 38 cooperatively define a theoretical medial plane 35 equidistant between them. Medial plane 35 is also equidistant between end pieces 24 and 30. The term "center point" refers to the point 37 at the intersection of the polar axis and the medial plane.

Figure 3:
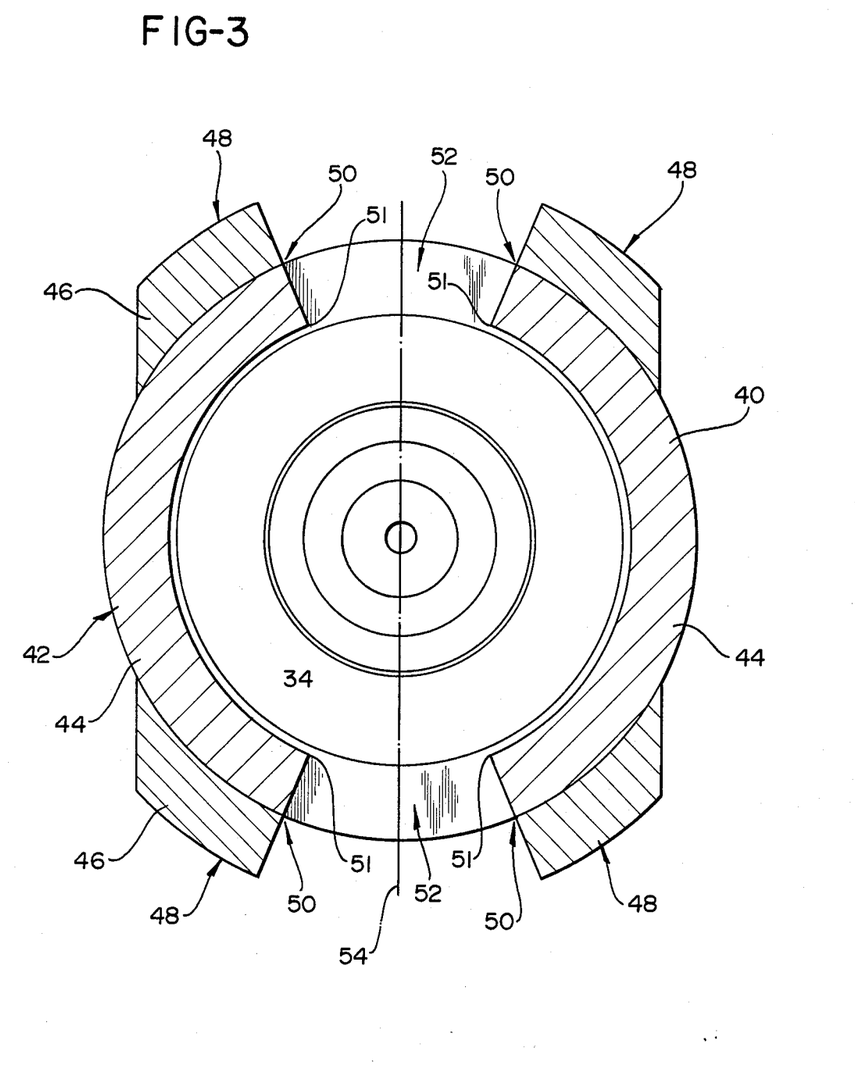
FIG. 3 is a schematic sectional view taken along line 3—3 in FIG. 2.
Figure 4:
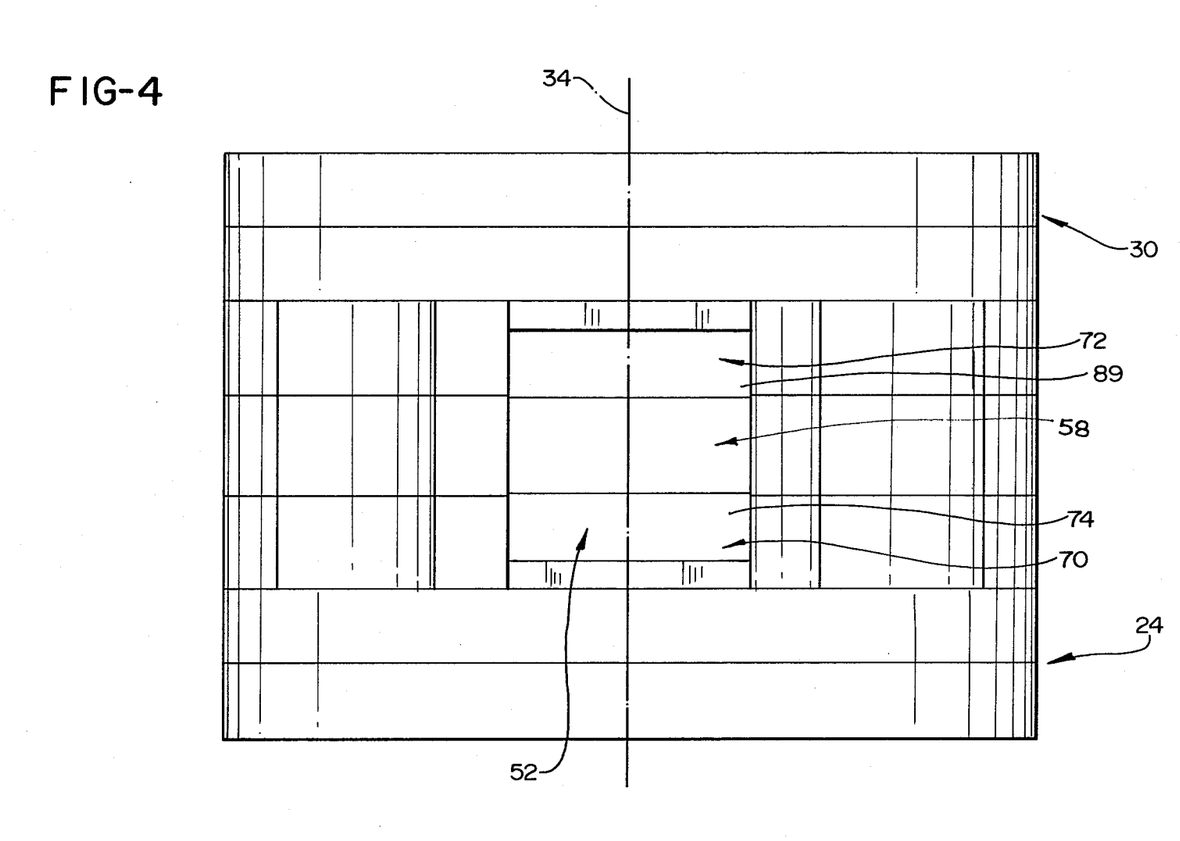
FIG. 4 is a schematic elevational view of the apparatus as shown in FIGS. 1-3.

Top end piece 30 is supported above bottom end piece 24 by axial connectors 40 and 42. Each axial connector is generally in the form of a segment of a right circular cylinder coaxial with polar axis 34. Each of these axial connectors includes three superposed sectors 44. Each of the sectors 44 is provided with a pair of projections 46 extending outwardly, away from one another at opposite ends of the sector. These projections 46 are superposed on one another and form columns 48 extending parallel to polar axis 34 at the edges of the axial connectors 40 and 42. As best seen in FIGS. 1 and 3, the edges of the individual sectors 44 and projections 46 are beveled so that the faces of the sector rings 44 and projections 46 cooperatively define generally planar faces 50 at the edges of axial connectors 40 and 42, these planar faces extending along substantially radial planes with respect to polar axis 34. The edges 51 of planar faces 50 closest to polar axis 34 define a pair of patient entry openings 52 leading from the outside of the frame to the space between end pieces 24 and 30. These openings are aligned with one another along a patient entry axis 54 orthogonal to polar axis 34. Openings 52 are of sufficient size for the body, i.e., the torso, of a normal human adult to be inserted therethrough. Appropriate means, preferably including a non-metallic, non-magnetic bed 56 are provided for positioning a patient P via the openings, so that the patient's body is positioned in the patient receiving space 58 between polar regions 36 and 38. The particular region of the patient's body to be scanned preferably is positioned within a predetermined scanning volume 60, which is a subregion of patient space 58 surrounding center point 37.

The primary field magnet assembly 10 also includes a lower superconducting coil assembly 70 and an upper superconducting coil assembly 72. Lower coil assembly 70 includes a toroidal, vacuum-tight container or cryostat vessel 74 formed from aluminum or another non-magnetic metal, insulation 76 disposed within vessel 74 and a liquid helium container 78 disposed within insulation 76. A coil 80 of conventional superconductive wire is mounted within liquid helium container 78. Coil 80 is generally loop-like and circular and defines an axis coincident with polar axis 34 and a coil plane 81 parallel to the medial plane 35. As used in this disclosure, the term "coil plane" refers to the central plane of the coil, i.e., to the plane perpendicular to the axis of the coil bisecting the coil.

An inner antibuckling ring 82 (FIG. 2A) is mounted within coil 80, whereas an outer clamping ring 84 encircles the coil, rings 82 and 84 also being concentric with polar axis 34. The coil 80 and rings 82 and 84 are supported within helium container 78 by a plastic washer 86 bearing on the coil and a pair of solid stainless steel support rings 85 and 87. The liquid helium container is supported within the vacuum container by coil support legs 88 penetrating through insulation 76. A plurality of coil support legs 88 are spaced around the periphery of this toroidal assembly. These legs are arranged to accommodate shrinkage of the coil and rings as occurs when the coil and rings are cooled. Appropriate means (not shown) are provided for feeding current to coil 80, and for feeding liquid helium into container 78 and evacuating the interior of vessel 74. Thus, vessel 74 and the associated components serve as cryostat means for maintaining coil 80 at the low temperatures, close to absolute zero below the critical temperature of the superconducting material in coil 80, where the material of the coil exhibits superconductivity.

Upper coil assembly 72 is of substantially the same construction as the lower coil assembly. Thus, the superconductive coil 90 of upper coil assembly 72 likewise has a coil axis coincident with polar axis 34 and a coil plane 91. The upper coil assembly also includes support and insulating structures as described, including a toroidal cryostat vessel 89. Coils 80 and 90 are disposed symmetrically with respect to medial plane 35, and the coil planes 89 and 91 of these coils are disposed closer to the medial plane than any interior portion of the frame. That is, no portion of the frame projects towards the medial plane from the end pieces through coil planes 81 and 91 inside the area encompassed by coils 80 and 90.

The scale of the primary field magnet assembly 22 can best be appreciated with reference to the drawing figure showing a patient P, and with reference to some of the dimensions typically employed. Thus, the overall height of frame 22 in the direction of polar axis 34 preferably is about 98", and each of the end pieces 24 and 30 is about 133" in diameter and about 25" thick. The axial connectors 40 and 42 (FIG. 3) define an inner circle approximately 104" in diameter. The inner faces of the end pieces 24 and 30 are approximately 48" apart, so that each is disposed 24" from medial plane 35. The cryostat vessels 74 and 89 are 16" apart, so that each is approximately 8" from medial plane 35. Thus, in this particular embodiment, the 16" dimension between the cryostats or vacuum containers 74 and 89 limits the height or dimension parallel to polar axis 34 of patient entry openings 52. The width of each patient entry opening, between the inner edges 51 of surfaces 50, is about 40". The outer diameter of each outer shim ring 62 and 64 is about 56", the inner diameter of each such outer shim ring is about 42", and each of these outer shim rings is about 5" thick in the direction parallel to polar axis 34. The outside diameter of each inner shim ring 66 and 68 is about 25", whereas the inner diameter of each such inner shim ring is about 5", and each inner shim ring is about 2.4" thick. The mean diameter of each of coils 80 and 90 is about 72" and the coil plane of each such coil is disposed about 13" from the medial plane.

The inner diameter of each vacuum vessels or cryostats 74 and 89 is about 56". Thus, although the cryostats are only about 16" apart in the direction parallel to the polar axis, and although each cryostat comes withiin 8" of the medial plane, each cryostat is disposed at a very substantial distance from center point 37; the minimum straight line distance from the centerpoint to either of the vacuum containers or cryostats is about 29". The magnet assembly 22 thus provides a large clearance volume around centerpoint 37. Thus, no component of the primary field magnet assembly, and particularly no metal component of the primary field magnet assembly, is disposed at a distance less than about 21.6" from center point 37. As used in this disclosure, the term "clearance radius" refers to the minimum distance from the center point to any physical component of the primary field magnet assembly, whereas the term "metal clearance radius" refers to the minimum distance from the center point to any metallic component of the primary field magnet assembly. As explained hereinbelow, a large clearance radius and, particularly, a large metal clearance radius is preferred. These dimensions are desirably about 15" or more and most preferably about 20" or more. In this embodiment, the components of the primary field magnet assembly, such as frame members and cryostat vessels which lie close to the center point, are all formed from metallic materials, and hence the metal clearance radius is equal to the clearance radius.

Although not a part of the primary field assembly, gradient coils 20 are disposed within the primary field magnet assembly, along polar axis 34 on opposite sides of the patient receiving space 58. If desired, the gradient coils can be installed so that they lie on opposite sides of the polar axis and so that an axis connecting the gradient coils is transverse to the polar axis. The gradient coils per se are conventional, and accordingly need not be described further herein. However, in this embodiment of the present invention, the gradient coils are disposed adjacent patient space 58 and scanning volume 60 and hence remote from end pieces 24 and 30, well within the metal clearance radius of the primary field assembly.

In operation, liquid helium is passed into the liquid helium container 78 of lower coil assembly 70 and into the corresponding liquid helium container of the upper coil assembly, so that both of the coils are maintained at superconducting temperatures. With the coils at superconducting temperatures, control means 12 introduces electric power into the coils, to start electric current flowing through the coils. These current flows are substantial, typically amounting to about $1.6 \times 10^6$ ampere turns in each of coils 80 and 90. The currents flowing in the coils induce very substantial magnetic fields. Because of the particular construction of the assembly 22, there is a large and very uniform magnetic field within patient receiving space 58, and specifically within the predetermined scanning volume 60. With the aforementioned $1.6 \times 10^6$ amp turn/coil current flows, the magnetic flux at center point 37, and within the scanning volume 60 surrounding the center point is approximately 3.1 Tesla, i.e., about 31 kilogauss. As will be appreciated, the uniformity of the magnetic field within the scanning volume 60 will depend upon the dimensions selected for scanning volume 60. However, many practitioners in the art consider an imaginary sphere 12" in diameter as a practical scanning volume over which a substantially uniform primary magnetic field should be maintained for medical NMR imaging purposes. Within a 12" diameter scanning volume, the apparatus of FIGS. 1-4 typically can maintain uniformity of about one part in $10^4$. This strong, uniform magnetic field provides good results in NMR scanning.

To provide a 3.1 Tesla field in scanning volume 60, the field within the polar regions 36 and 38 of the frame necessarily is above the saturation value for the metal of the frame. The field ($\vec{B}$) in any small subregion or "domain" within the polar regions is equal to the vector sum of the magnetization ($\vec{M}$) of the material within that domain and the magnetomotive force ($\vec{H}$) applied to that domain by the remainder of the system, i.e., by the other ferromagnetic material in the frame and by the coils. The magnitude of $\vec{M}$ cannot exceed the saturation value of the material, typically about 2.2 Tesla for common materials. However, the magnitude of $\vec{B}$ can and does exceed this value. Although the present invention is not limited by any theory of operation, it is believed that the material in the frame remote from the polar regions contributes components of $\vec{H}$ which assist in maintaining the uniform, axially directed field in the polar regions. Particularly, it is believed that the material of end pieces 24 and 30 towards the axially outward sides of these pieces, remote from medial plane 35, and the material of the end pieces remote from polar axis 34 contribute to the field in the polar regions.

In the scanning procedure, control means 12 and gradient excitation means 18 operate gradient coils 20 to provide relatively small magnetic fields varying in time in known manner, and these magnetic fields are superimposed on the primary field created by the primary field assembly 22 within scanning volume 60. The control means 12 also cooperates with RF excitation means 14 and RF detection means 16 to apply appropriate radio frequency signals to that portion of the patient's body disposed within scanning volume 60 and to detect the resulting RF nuclear magnetic resonance signals from those portions. As well known to those skilled in the art of medical NMR imaging, appropriate mathematical processing is applied by control means 12 to relate the operation of the gradient coils and RF excitation means and the detected signals so as to create an image of the bodily structures located in scanning volume 60.

As those skilled in the NMR imaging art will appreciate, faster operation of gradient coils 20, to provide faster variation in the gradient fields superimposed on the primary field, generally will permit faster completion of a given scanning and imaging operation. Rapid operation of gradient coils 20 is facilitated by the large spacing between the gradient coils and the closest metallic structures of the primary field magnet assembly. This spacing desirably is at least about 5", 10" being more preferred. As mentioned above, this large spacing is facilitated by the relatively large metal clearance radius of the primary field magnet assembly 22. This large metal clearance radius and large spacing between the gradient coils and other metal structures is achieved even though the cryostat vessels 74 and 89 are metallic.

The magnetic flux generated by the flowing currents in coils 80 and 90 interacts with the frame. As mentioned above, the polar regions carry high, axially-directed magnetic fields, so that the magnetic flux passes between these regions and substantially parallel to polar axis 34. The axial connectors 40 and 42, and the columns 48 extending along the margins of the axial connectors form flux return paths extending parallel to the polar axis between the end pieces. These flux paths serve to carry the return lines of flux, i.e., the lines of flux extending counter directionally to the flux between the polar regions. As will be appreciated, the coils 80 and 90 are substantially disposed within an enclosed shell defined by frame 22, and the flux generated by these coils is substantially confined to the interior of the shell and to within the shell walls. The flux outside of the frame is essentially zero. Because the field is essentially confined within the frame, disturbances outside the frame, as may be caused by moving metallic objects, will not appreciably affect the field within the frame, and particularly will not affect the field in the scanning volume 60. Of course, because the field is confined in this fashion, magnetic materials outside of the device will not be attracted or propelled by the field and hence will not pose a safety hazard.

Because essentially all of the flux entering the scanning volume is flux which enters from the frame, the primary field is substantially desensitized to any movement of the coils 80 and 90. Although the present invention is not limited by any theory of operation, and although a complete discussion of the physics of magnetic field stabilization is beyond the scope of this disclosure, one way to appreciate this phenomenon is by the mathematical construction of virtual current rings. Thus, it can be shown mathematically that the flux emanating from the top end piece 30 under the influence of a current passing within coil 90 will have the same pattern as would be generated by a current $I_v$ flowing in an imaginary wire coil of diameter equal to coil 90 but disposed within end piece 30 at a distance from the end piece surface equal to the distance from the end piece surface to coil plane 91 of coil 90. If the coil 90 is somehow displaced upwardly towards the lower surface of piece 30, such movement would tend to distort the field in scanning volume 60. However, any such movement of coil 90 would produce a corresponding virtual "movement" of the virtual current coil carrying current $I_v$. This movement would bring the virtual coil downwardly closer to the surface of piece 30 when the real coil 90 moves closer to the surface as postulated. Conversely, where the real coil 90 moves downwarly away from the surface of piece 30, the virtual coil carrying current $I_v$ would move upwardly away from the surface of the end piece. In each case, the movement of the virtual or hypothetical coil would be in the opposite direction to the movement of the real coil. The system would in each case act as if it had an additional coil, and as if an automatic control system had moved the additional coil in the opposite direction from the actual movement of the real coil. In each case, the movement of this additional or virtual coil indicates that the flux pattern emanating from the end piece 30 would change so as to oppose the changes caused by movement of the real coil 90. As will be appreciated by those skilled in magnetic physics, the virtual coil and virtual current $I_v$ discussed above are essentially first order effects, and there are additional, second order virtual coil effects caused by movement of the first virtual coil. However, the general picture is substantially as indicated; as a real coil is displaced, the magnetic flux emanating from the frame changes so that the change in flux from the frame opposes the change caused by movement of the real coil. These effects substantially reduce the sensitivity of the field, and particularly the field within scanning volume 60, to coil movements.

Moreover, coil movements themselves are substantially reduced by virtue of several unique coactions in this device. First, the flux concentration affected by the ferromagnetic frame 22 permits a dramatic reduction in the currents flowing in the coils. Thus, to achieve the same peak flux at the center point 37 with coils of comparable dimension and positioning relative to the center point, but without the frame 22, the coils necessarily would carry almost twice the current as required in the device as shown. Thus, the magnetic forces tending to burst the windings of each coil radially outwardly, away from polar axis 34 would be approximately doubled. Stated another way, the frame affords a twofold reduction in these disturbing and distorting forces.

Moreover, the frame affords approximately a fifteenfold reduction in forces tending to displace the coils axially. Again, carrying the current required to produce the 3.1 Tesla field at center point 37, a scanner employing only the two coils without the frame would have forces of approximately 2,800,000 pounds acting on the coils, tending to pull the coils together. However, in the scanner according to the present invention as illustrated, each coil is attracted to the adjacent end piece. These end piece attracting forces tend to pull the coils apart, and hence tend to balance the attracting forces between the coils. Moreover, the lower currents carried by the coils in the present scanner further reduce the magnitude of the axial forces. Thus, in the device as shown, the net axial force on each coil amounts to only about 190,000 pounds during operation of about 3.1 Tesla field as mentioned. These net forces on the coils tend to pull each coil closer to the adjacent end piece. As will be appreciated, the balancing between oppositely directed attracting forces on each coil can be adjusted further if desired so as to further reduce the net forces on each coil substantially to zero if desired.

The relatively low forces of the coils during operation permit the use of relatively few of the coil supporting legs 88 penetrating through the insulation 76 (FIG. 2A). This is advantageous to minimize heat gain to the coil from the warm environment and hence to minimize the cost of liquid helium consumed during operation.

Figure 5:
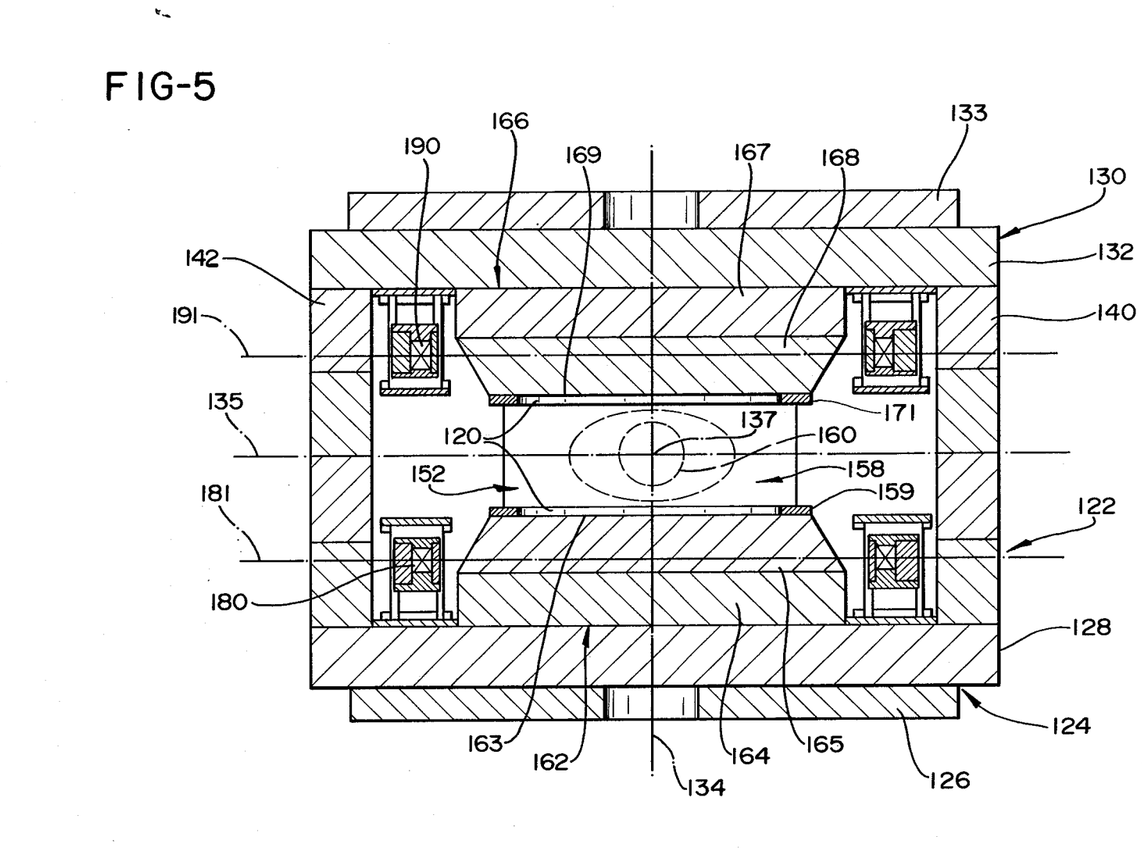
FIG. 5 is a schematic sectional view, similar to FIG. 2, but illustrating a portion of apparatus according to a further embodiment of the invention.

Portions of a scanner according to a further embodiment of the present invention are illustrated in FIG. 5. This apparatus is generally similar to the apparatus discussed above with reference to FIGS. 1–4. As will be appreciated, the apparatus of FIG. 5 includes control means, RF excitation and detection means and gradient excitation means as discussed above. The primary field magnet assembly 110 is also generally similar to that discussed above. However, the frame 122 illustrated in FIG. 5 has somewhat thinner end pieces 124 and 130. The upper plate 128 of lower end piece 124 and the lower plate 132 of upper end piece 130 are cylindrical but of somewhat smaller diameter than the plates utilized in the embodiment discussed above. In the embodiment of FIG. 5, the plates remote from the medial plane 135, i.e., the lower plate 126 of lower end piece 124 and the upper plate 134 of upper end piece 130 are ring-like rather than circular. Moreover, the frame includes a ferromagnetic lower pole piece 162 projecting axially inwardly, towards medial plane 135 from lower end piece 124, beyond the coil plane 181 of lower coil 180. The lower pole piece 162 terminates at a lower pole face 163 relatively close to the patient space 158, typically about 10.5" from medial plane 135. Lower pole piece 162 includes a cylindrical lower pole stem 164 of about 64" diameter and a frustoconical pole facing piece 165 which tapers inwarly to a circular pole face 163 about 54" in diameter. The pole piece also includes a lower shim ring 159 about 1" thick and about 2" wide covering the peripheral portion of lower pole face 163. Thus, the lower pole piece 162 provides a polar region adjacent medial plane 135, axialy inward of the coil plane 181 of coil 180.

The upper end piece 132 is provided with a similar upper pole piece 166 including cylindrical upper pole stem 167 and frustoconical upper pole facing piece 168 and upper shim ring 171 projecting axially inwardly beyond the coil plane 191 of upper coil 190. The pole facing piece 168 and shim ring 171 of upper pole piece 166 thus define an upper polar region 169 encompassing the polar axis 134 on the opposite side of medial plane 135 from the lower pole 163. These physical poles of the ferromagnetic frame are thus closely juxtaposed with the patient space and with the center point 137 (the point of intersection between the polar axis 134 and medial plane 135).

The frame also includes axial connecting pieces 140 and 142 extending between the end pieces 124 and 130 and substantially encompassing the patient space 158 apart from patient entry openings 152 of which only one is visible in FIG. 5.

Superconducting coils 180 and 190, and the associated cryostatic devices and supporting members are generally similar to those described above. However, the coils 180 and 190 are arranged to carry fewer ampere-turns. As will be readily appreciated, the ferromagnetic frame as shown in FIG. 5 provides particularly effective flux concentration at the scanning volume 160 surrounding center point 137. Stated another way, the ratio of flux level in scanning volume 160 to ampere turns in coils 180 and 190 is higher for this embodiment because the flux concentration is so effective. Substantially all of the flux entering scanning volume 160 passes through the frame, and specifically through the pole pieces 162 and 166. Apparatus as shown in FIG. 5 is preferably operated at flux levels well below about 2.2 Tesla, most preferably at about 1.2–1.5 Tesla. Here again, the present invention is not limited by any theory of operation. However, it is believed that creation of a substantially uniform field within scanning volume 160 involves interactions between the ferromagnetic material remote from polar axis 134 with the material adjacent axis 134. To provide a uniform, axially-directed field as high as the preferred 1.2–1.5 Tesla range adjacent the polar axis, the material remote from the polar axis typically is at a magnetization M approaching saturation, i.e., about 2.2 Tesla. Stated another way, the particular diameters of the pole pieces 162 and 166 are useful in providing a uniform field of 1.2–1.5 Tesla over a scanning volume of about 12" or more diameter. Materially smaller diameters, less than about 50" at the pole faces are distinctly less preferred. Moreover, the tapering configuration of the pole pieces and the shim rings 159 and 171 aid in shaping the "fringing" field remote from the polar axis, and hence in shaping the field in the scanning volume.

The apparatus of FIG. 5 has almost complete immunity from flux variations caused by coil movements. Stated another way, the virtual current effects are particularly strong in apparatus as shown in FIG. 5. However, the apparatus as shown in FIG. 5 does not provide a particularly large metal clearance radius. Thus, the conventional gradient coils 120 used in this apparatus are relatively closely juxtaposed with the pole piece assemblies. The apparatus as shown in FIG. 5 also provides good field uniformity, better than about 1 parts in $10^4$.

As will be readily appreciated by those skilled in the art, the features described above can be varied significantly. Merely by way of example, the apparatus can be oriented differently, so that the polar axis extends horizontally rather than vertically as shown. The shim rings mentined above can be detachably mounted to the remainder of the frame, so that other shim rings can be substituted for the original shim rings. These other shim rings can be selected to provide optimum field configurations where the coils are operated at lower than normal amperage. Thus, the primary field can be "tuned" or adjusted to a different, lower value if desired. Other, known shimming and field adjusting techniques can be applied in conjunction with the primary field magnet assemblies of the scanners described above to provide even more uniform primary fields. For example, supplemental coils can be added to the primary field magnet assembly. However, one particular advantage of the primary field magnet assemblies according to the present invention is that they can provide relatively good fields, which can be used for medical NMR imaging, with only minimal adjustment the use of these auxiliary devices. Stated another way, in devices according to preferred forms of the present invention, shimming and field adjusting techniques make a good field better rather than raise a poor field to an acceptable level of uniformity. Also, although the advantages of the present invention are realized especially well in the case of superconducting coils, at least some of the advantages of the invention can be obtained with ordinary coils rather than superconducting coils as used in the preferred embodiments described above. Particularly, assemblies as discussed above with reference to FIG. 5 are well suited to use with ordinary coils. As those skilled in the art will appreciate, the number of ampere turns which can be accommodated in a non-superconducting coil is limited by considerations of heat evolution in the coil and the like. As the embodiment discussed above with reference to FIG. 5. tends to provide the greatest degree of flux concentration, the same is particularly preferred with non-superconducting coils.

In the embodiments discussed above, all of the components of the frame are substantially symmetrical about the polar axis and about the medial plane. However, this is not absolutely essential. Thus, the flux return path components need not be symmetrical about the polar axis. For example, the frame may be generally C-shaped, with the tips of the C defining the poles and polar axis and with the flux return path extending on one side only of the polar axis.

As these and other variations and combinations of the features described above can be utilized without departing from the present invention as defined in the claims, the foregoing description of the preferred embodiments should be understood as illustrating rather than as limiting the invention as defined in the claims.

What is claimed is:

1. A medical NMR scanner comprising a primary field magnet assembly including:
   (a) a ferromagnetic frame defining a patient-receiving space adapted to receive a human body, said frame having a pair of opposed polar regions aligned on a polar axis and disposed on opposite sides of said patient-receiving space, and said frame including a substantially continuous ferromagnetic flux return path extending between said polar regions remote from said patient-receiving space;
   (b) flux-generating means including a plurality of superconductive windings and cryostat means for maintaining said windings at superconducting temperatures; and
   (c) support means for maintaining said windings in proximity to said frame so that when a current passes through said windings magnetic flux emanating from said windings produces a magnetic field within said patient-receiving space and at least a portion of said flux passes into said patient-receiving space by way of said polar regions.

2. A scanner as claimed in claim 1 wherein said windings include a pair of loop-like coils, each having a coil plane and a coil axis orthogonal to the coil plane, said support means including means for holding each of said loop-like coils so that said coils are disposed on opposite sides of said patient receiving space, and so that said coil axes are substantially aligned with said polar axis.

3. A scanner as claimed in claim 2 wherein said frame defines a medial plane perpendicular to said polar axis equidistant from said polar regions, said frame including a pair of opposed platelike end pieces disposed on opposite sides of said patient-receiving space and extending transverse to said polar axis, said support means being operative to hold each of said coils in proximity to one of said end pieces.

4. A scanner as claimed in claim 3 wherein said end pieces extend substantially parallel to said medial plane and are substantially equidistant from said medial plane.

5. A scanner as claimed in claim 3 wherein said frame includes at least one axial connecting element extending between said end pieces.

6. A scanner as defined in claim 5 wherein said at least one axial connecting element includes a pair of lateral walls extending between said end pieces on opposite sides of said polar axis.

7. A scanner as defined in claim 6 wherein said lateral walls cooperatively define a pair of patient entry openings aligned with one another along an opening axis transverse to said polar axis, said patient entry openings being of sufficient size to admit a human torso endwise, whereby a patient may be inserted through said openings so that a portion of said patient's torso is disposed within said patient-receiving space and so that the long axis of the patient's torso extends transverse to said polar axis.

8. A scanner as claimed in claim 3 wherein said frame includes a pair of pole pieces, one of said pole pieces extending from each of said end pieces substantially along said polar axis toward said medial plane, said pole pieces defining said polar regions.

9. A scanner as claimed in claim 8 wherein each of said pole pieces extends through the coil plane of one of said coils.

10. A scanner as claimed in claim 9 wherein each of said pole pieces includes a frustoconical pole facing piece tapering inwardly in the axially inward direction toward said medial plane and defining a circular pole face transverse to said polar axis adjacent said medial plane.

11. A scanner as claimed in claim 10 wherein each of said pole pieces includes a shim ring projecting from said circular pole face adjacent the periphery thereof.

12. A scanner as claimed in claim 11 wherein each of said pole faces is at least about 50 inches in diameter.

13. A scanner as claimed in claim 12 wherein each of said pole pieces is substantially in the form of a surface of revolution about said polar axis and each said pole piece is at least about 60 inches in diameter at its juncture with the associated one of said end pieces.

14. A scanner as claimed in claim 3 wherein said frame does not penetrate the coil planes of said coils.

15. A scanner as claimed in claim 14 wherein said frame includes ferromagnetic shim rings mounted to said end pieces, said shim rings and said end pieces cooperatively defining said polar regions.

16. A scanner as claimed in claim 14, wherein said primary field magnet assembly has a metal clearance radius of at least about 10 inches, the scanner further comprising gradient coils disposed adjacent said polar axis on opposite sides of said patient space but adjacent to said patient space, said gradient coils being remote from said frame.

17. A scanner as claimed in claim 16 wherein said cryostat means includes a vessel encompassing each of said coils.

18. A scanner as claimed in claim 17 wherein each of said vessels is a generally toroidal metallic chamber substantially coaxial with said polar axis.

19. A scanner as claimed in claim 14 wherein the minimum distance between said gradient coils and the closest one of said frame and said vessels is at least about 5 inches.

20. A scanner as claimed in claim 19 wherein said minimum distance is at least about 10 inches.

21. A scanner as claimed in claim 1, wherein said primary field magnet assembly is operative to provide a magnetic field having a strength of at least about 1 Tesla and having a uniformity of one part in $10^4$ or better over a scanning volume encompassing at least a sphere 12 inches in diameter within said patient-receiving space.

22. A scanner as claimed in claim 21 wherein said primary field magnet assembly is operative to provide a field having a strength of at least about 1.2 Tesla.

23. A scanner as claimed in claim 22 wherein said primary field magnet assembly is operative to provide a field having a strength of at least about 3 Tesla.

24. A scanner as claimed in claim 22 wherein said supporting means support said windings in proximity to said frame so that the magnetic flux entering said scanning volume when said windings are energized enters said scanning volume predominantly by way of said polar regions.

25. A scanner as claimed in claim 24 wherein said supporting means support said windings in proximity to said frame so that substantially all of the magnetic flux entering said scanning volume when said windings are energized enters said scanning volume by way of said polar regions.

26. A medical NMR scanner comprising a primary field magnet assembly including:
 (a) a ferromagnetic frame defining a patient-receiving space adapted to receive a human body, said frame including a pair of pole pieces projecting along a polar axis towards said patient-receiving space from opposite sides thereof, each of said pole pieces being substantially in the form of a body of revolution about said polar axis, each of said pole pieces tapering inwardly in the axially inward direction towards said patient-receiving space, said frame also including a substantially continuous flux return path extending between said pole pieces remote from said patient-receiving space; and
 (b) flux generating means including windings encircling said pole pieces.

27. A scanner as claimed in claim 26 wherein said frame includes a pair of end pieces extending transverse to said polar axis and at least one axial connecting element extending between said end pieces remote from said polar axis, said pole pieces projecting axially inwardly from said end pieces.

28. A scanner as claimed in claim 27 wherein each of said pole pieces includes a frustoconical pole facing piece tapering inwardly in the axially inward direction toward said patient-receiving space and defining a circular pole face transverse to said polar axis adjacent said patient-receiving space.

29. A scanner as claimed in claim 28 wherein each of said pole pieces includes a shim ring projecting from said circular pole face adjacent the periphery thereof.

30. A scanner as claimed in claim 29 wherein each of said pole faces is at least about 50 inches in diameter.

31. A scanner as claimed in claim 13 wherein each said pole piece is at least about 60 inches in diameter at its juncture with the associated one of said end pieces.

32. A medical NMR scanner comprising a primary field magnetic assembly including:
(a) a ferromagnetic frame defining a patient-receiving space adapted to receive a human body, said frame including a pair of pole pieces projecting along a polar axis toward said patient-receiving space from opposite sides thereof, said pole pieces, being spaced from one another to define a medial plane perpendicular to said polar axis equidistant from said pole pieces each of said pole pieces including a frustoconical pole facing piece tapering inwardly in an axially inward direction toward said medial plane and defining a circular pole face transverse to said polar axis adjacent to said medial plane, and said frame also including a substantially continuous flux return path extending between said pole pieces remote from said patient-receiving space;
(b) flux generating means including a pair of coils having superconductive windings and cryostat means for maintaining said superconductive windings at superconducting temperatures, each of said coils having a coil plane and a coil axis orthogonal to said coil planes; and
(c) support means for maintaining said coils in proximity to said frame so that when a current passes through said windings of said coils, magnetic flux emanating from said windings produces a magnetic field within said patient-receiving space and at least a portion of said flux passes into said patient-receiving space by way of said pole pieces, said support means including means for holding said coils in relation to said pole pieces so that said coils are disposed on opposite sides of said patient-receiving space with said coil axes being substantially aligned with said polar axis, and so that each of said pole pieces extends through said coil plane of one of said coils.

33. A scanner as claimed in claim 32 wherein said frame includes a pair of opposed end pieces disposed on opposite sides of said patient-receiving space and extending transverse to said polar axis, and wherein each of said pole pieces extend from one of said end pieces substantially along said polar axis toward said medial plane.

34. A scanner as claimed in claim 33 wherein each of said pole pieces includes a shim ring projecting from said circular pole face adjacent the periphery thereof.

35. A scanner as claimed in claim 33 wherein each of said pole faces is at least about 50 inches in diameter.

36. A medical NMR scanner comprising a primary field magnet assembly including:
(a) a ferromagnetic frame defining a patient-receiving space adapted to receive a human body, said frame having a pair of opposed polar regions aligned on a polar axis and disposed on opposite sides of said patient-receiving space;
(b) flux-generating means including a plurality of superconductive windings and cryostat means for maintaining said windings at superconducting temperatures;
(c) support means for maintaining said windings in proximity to said frame so that when a current passes through said windings magnetic flux emanating from said windings produces a magnetic field within said patient-receiving space and at least a portion of said flux passes into said patient-receiving space by way of said polar regions; and
(d) said ferromagnetic frame in combination with said flux generating means being operative to provide a magnetic field having a strength of at least one Tesla and having a uniformity of one part in $10^4$ or better in a scanning volume encompassing at least a sphere twelve inches in diameter within said patient-receiving space.

37. A scanner as claimed in claim 36 wherein said primary field magnet assembly is operative to provide a field having a strength of at least about 3 Tesla.

38. A scanner as claimed in claim 37 wherein said supporting means support said windings in proximity to said frame so that the magnetic flux entering said scanning volume when said windings are energized enters said scanning volume predominantly by way of said polar regions.

39. A medical NMR scanner comprising a primary field magnet assembly including:
(a) a ferromagnetic frame defining a patient-receiving space adapted to receive a human body, said frame including a pair of pole pieces projecting along a polar axis towards said patient-receiving space from opposite sides thereof and a pair of end pieces extending transverse to said polar axis and arranged with respect to said pole pieces on opposite sides of said patient-receiving space so that said pole pieces project axially inward from said end pieces, each of said pole pieces being substantially in the form of a body of revolution about said polar axis, each of said pole pieces tapering inwardly in the axially inward direction toward said patient-receiving space, and said frame also including at least one axial connecting element extending between said end pieces remote from said polar axis to provide a substantially continuous flux return path between said pole pieces remote from said patient-receiving space; and
(b) flux generating means include windings encircling said pole pieces.

40. A scanner as claimed in claim 39 wherein each of said pole pieces includes a frustoconical pole facing piece tapering inwardly in the axially inward direction toward said patient-receiving space and defining a circular pole face transverse to said polar axis adjacent said patient-receiving space.

41. A scanner as claimed in claim 40 wherein each of said pole pieces includes a shim ring projecting from said circular pole face adjacent the periphery thereof.

42. A scanner as claimed in claim 41 wherein each of said pole faces is at least about 50 inches in diameter.

43. A medical NMR scanner comprising a primary field magnetic assembly including:
(a) a ferromagnetic frame defining a patient-receiving space adapted to receive a human body, said frame including a pair of opposed, transversely extending end pieces disposed on opposite sides of said patient-receiving space and defining a pair of opposed polar regions aligned on a polar axis extending between said end pieces, and said frame further including a substantially continuous ferromagnetic flux return path extending between said end pieces remote from said patent receiving space;

(b) flux generating means including a pair of coils having superconductive windings and cryostat means for maintaining said superconductive windings at superconducting temperatures, each of said coils having a coil plane and a coil axis orthogonal to said coil plane; and (c) support means for maintaining said coils in proximity to said end pieces of said frame so that when a current passes through said windings of said coils, magnetic flux emanating from said coils produces a magnetic field within said patient-receiving space and at least a portion of said flux passes into said patient-receiving space by way of said polar regions, said support means including means for holding each of said coils in proximity to one of said end pieces in a manner so that said coils are disposed on opposite sides of said patient-receiving space with said coil axes substantially aligned with said polar axes, and so that the magnetic flux entering a scanning volume within said patient-receiving space when said windings are energized enters said scanning volume predominantly by way of said polar regions.

44. A scanner as claimed in claim 43 wherein said coils are arranged so that said frame does not penetrate said coil planes of said coils.

45. A scanner as claimed in claim 44 wherein said frame includes ferromagnetic shim rings mounted to said end pieces, said shim rings and said end pieces cooperatively defining said polar regions.

46. A scanner as claimed in claim 45 wherein said primary field magnet assembly has a metal clearance radius of at least about 10 inches, the scanner further comprising gradient coils disposed adjacent said polar axis on opposite sides of said patient space but adjacent to said patient space, said gradient coils being remote from said frame.

47. A scanner as claimed in claim 46 wherein said cryostat means includes a vessel encompassing each of said coils.

48. A scanner as claimed in claim 47 wherein each of said vessels is a generally toroidal metallic chamber substantially coaxial with said polar axis.

49. A scanner as claimed in claim 44 wherein said coils are arranged so that said frame penetrates said coil planes of said coils.

50. A medical NMR scanner comprising a primary field magnetic assembly including:

(a) a ferromagnetic frame defining a patient-receiving space adapted to receive a human body, said frame including a pair of opposed, transversely extending end pieces disposed on opposite sides of said patient-receiving space and defining a pair of opposed polar regions aligned on a polar axis extending between said end pieces, and said frame further including a substantially continuous ferromagnetic flux return path extending between said end pieces remote from said patent receiving space;

(b) flux generating means including a pair of coils having superconductive windings and cryostat means for maintaining said superconductive windings at superconducting temperatures, each of said coils having a coil plane and a coil axis orthogonal to said coil plane; and (c) support means for maintaining said coils in proximity to said end pieces of said frame so that when a current passes through said windings of said coils. magnetic flux emanating from said coils produces a magnetic field within said patient-receiving space and at least a portion of said flux passes into said patient-receiving space by way of said polar regions, said support means including means for holding each of said coils in proximity to one of said end pieces in a manner so that said coils are disposed on opposite sides of said patient-receiving space with said coil axes being substantially aligned with said polar axis, and said coils and said end pieces being so arranged that the magnetic attraction forces between each of said coils and the respective end piece it is in proximity to substantially balances the magnetic attraction forces between said coils themselves.

51. A scanner as claimed in claim 50 wherein said end pieces extend substantially parallel to one another on opposite sides of said patient-receiving space.

52. A scanner as claimed in claim 51 wherein said flux return path comprises at least one axial connecting element extending between said end pieces.

53. A medical NMR scanner comprising a primary field magnet assembly including:

(a) a ferromagnetic frame defining a patient-receiving space adapted to receive a human body, said frame including a pair of opposed, transversely extending end pieces disposed on opposite sides of said patient-receiving space and defining a pair of opposed polar regions aligned on a polar axis extending between said end pieces, and said frame further including a pair of lateral walls extending between said end pieces on opposite sides of said polar axis to provide a substantially continuous ferromagnetic flux return path extending between said end pieces, said lateral walls cooperatively defining a pair of patient entry openings aligned with one another along an opening axis transverse to said polar axis, said patient entry openings being of sufficient size to emit a human torso endwise whereby a patient may be inserted through said entry openings so that a portion of said patient's torso is disposed within said patient-receiving space and so that the long axis of the patient's torso extends transverse to said polar axis;

(b) flux generating means including a pair of coils having superconductive windings and cryostat means for maintaining said windings at superconducting temperatures each of said coils having a coil plane and a coil axis orthogonal to said coil plane; and (c) support means for maintaining said coils in proximity to said end pieces of said frame so that when a current passes through said windings of said coils, magnetic flux emanating from said coils produces a magnetic field within said patient-receiving space and at least a portion of said flux passes into said patient-receiving space by way of said polar regions, said support means including means for holding each of said coils is proximity to one of said end pieces so that said coils are disposed on opposite sides of said patient-receiving space and so that said coil axes are substantially aligned with said polar axis.

* * * * *

UNITED STATES PATENT AND TRADEMARK OFFICE
CERTIFICATE OF CORRECTION

PATENT NO. : 4,766,378
DATED : August 23, 1988
INVENTOR(S) : Danby et al.

It is certified that error appears in the above-identified patent and that said Letters Patent is hereby corrected as shown below:

Column 2, line 66, delete "with" and insert therefor --will--.

Column 4, line 21, delete "are" and insert therefor --the--;
         line 22, delete "surrounding" and insert therefor --scanning--;
         line 25, delete "of" and insert therefor --on--.

Column 12, line 23, delete "of" and insert therefor --on--;
          line 55, "inwarly" should read --inwardly--.

Column 13, line 63, "mentined" should read --mentioned--.

Column 16, line 11, delete "14" and insert therefor --18--;
          line 29, delete "22" and insert therefor --21--.

Column 17, line 6, delete "13" and insert therefor --30--;
          line 53, delete "33" and insert therefor --32--;
          line 56, delete "33" and insert therefor --32--.

Column 18, line 18, delete "37" and insert therefor --36--.

UNITED STATES PATENT AND TRADEMARK OFFICE
CERTIFICATE OF CORRECTION

PATENT NO. : 4,766,378
DATED : August 23, 1988
INVENTOR(S) : Danby et al.

Page 2 of 2

It is certified that error appears in the above-identified patent and that said Letters Patent is hereby corrected as shown below:

```
Column 19, line  2, "patent receiving" should read
                    --patient-receiving--;
           line 47, delete "44" and insert therefor --43--;
           line 61, "patent receiving" should read
                    --patient-receiving--.

Column 20, line 22, delete "51" and insert therefor --50--;
           line 62, delete "is" and insert therefor --in--.
```

Signed and Sealed this

Twenty-eighth Day of March, 1989

Attest:

DONALD J. QUIGG

*Attesting Officer*

Commissioner of Patents and Trademarks